US008174094B2

(12) United States Patent
Chen et al.

(10) Patent No.: US 8,174,094 B2
(45) Date of Patent: May 8, 2012

(54) BONDED STRUCTURES FORMED BY PLASMA ENHANCED BONDING

(75) Inventors: Chien-Hua Chen, Corvallis, OR (US);
Barry C. Snyder, Bend, OR (US);
Ronald A. Hellekson, Eugene, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 135 days.

(21) Appl. No.: 12/488,571

(22) Filed: Jun. 21, 2009

(65) Prior Publication Data

US 2009/0256882 A1 Oct. 15, 2009

Related U.S. Application Data

(62) Division of application No. 10/977,141, filed on Oct. 29, 2004, now Pat. No. 7,563,691.

(51) Int. Cl.
*H01L 21/4763* (2006.01)
(52) U.S. Cl. ......... 257/625; 257/E21.122; 257/E23.023; 257/E27.137; 257/779; 347/65; 438/406; 438/455
(58) Field of Classification Search .................. 257/625, 257/779, E21.122, E23.023, E27.137; 438/406, 438/455; 347/65
See application file for complete search history.

(56) References Cited

U.S. PATENT DOCUMENTS

| 5,665,249 | A | 9/1997 | Burke et al. |
| 5,773,553 | A | 6/1998 | Fuller et al. |
| 5,821,595 | A * | 10/1998 | Trimmer et al. ............... 257/417 |
| 6,076,912 | A | 6/2000 | Murthy |
| 6,492,204 | B1 * | 12/2002 | Jacobs ........................... 438/127 |
| 6,500,694 | B1 | 12/2002 | Enquist |
| 6,554,408 | B1 * | 4/2003 | Miki et al. ...................... 347/70 |
| 6,563,133 | B1 | 5/2003 | Tong |
| 6,594,898 | B1 | 7/2003 | Yun |
| 6,641,254 | B1 | 11/2003 | Boucher et al. |
| 6,645,828 | B1 | 11/2003 | Farrens et al. |
| 6,780,759 | B2 | 8/2004 | Farrens et al. |
| 6,902,987 | B1 | 6/2005 | Tong et al. |
| 7,091,650 | B2 * | 8/2006 | Xu et al. ......................... 310/330 |
| 2003/0057538 | A1 | 3/2003 | Watson |
| 2003/0081073 | A1 | 5/2003 | Chen et al. |
| 2003/0141502 | A1 | 7/2003 | Tong |
| 2003/0145940 | A1 | 8/2003 | Chaudhury et al. |
| 2003/0159773 | A1 | 8/2003 | Tomiyama et al. |
| 2003/0181001 | A1 | 9/2003 | Aga et al. |
| 2004/0058476 | A1 | 3/2004 | Enquist et al. |
| 2004/0152282 | A1 | 8/2004 | Tong et al. |
| 2004/0209441 | A1 | 10/2004 | Maleville et al. |

(Continued)

FOREIGN PATENT DOCUMENTS

EP 0651449 5/1995

(Continued)

OTHER PUBLICATIONS

Supplementary European Search Report, for Application No. EPO10185411.5. Report issued Nov. 17, 2010; 3 pags.

(Continued)

*Primary Examiner* — Asok Sarkar

(57) ABSTRACT

An electronic device comprises a substrate comprising a first surface and a second surface, a substrate carrier comprising a first surface and a second surface, and an inorganic material bonding the second surface of the substrate and the second surface of the substrate carrier.

10 Claims, 13 Drawing Sheets

U.S. PATENT DOCUMENTS

| | | |
|---|---|---|
| 2005/0124138 A1 | 6/2005 | Aspar et al. |
| 2006/0032582 A1 | 2/2006 | Chen et al. |
| 2006/0223282 A1 * | 10/2006 | Amundson et al. ........... 438/458 |

FOREIGN PATENT DOCUMENTS

| | | |
|---|---|---|
| EP | 1329489 | 7/2003 |
| JP | 07-249749 | 9/1995 |
| JP | 09-314835 | 12/1997 |
| JP | 2002-145676 | 5/2002 |
| JP | 2003-273312 | 9/2003 |
| WO | WO0161743 | 8/2001 |

OTHER PUBLICATIONS

PlÖβl et al., Wafer direct bonding: tailoring adhesion between brittle materials, 1999, Material Science and Engineering, R25; p. 7.

* cited by examiner

BONDED STRUCTURES FORMED BY PLASMA ENHANCED BONDING

RELATED APPLICATIONS

The present patent application is a divisional of U.S. patent application having the Ser. No. 10/977,141, and filed on Oct. 29, 2004 now U.S. Pat. No. 7,563,691.

BACKGROUND

The market for electronic devices continually demands higher performance at lower costs. In order to meet these requirements the components which comprise various electronic devices need to be made more efficiently and to closer tolerances.

In certain electronic devices a silicon substrate is bonded or otherwise coupled to another substrate or substrate carrier to form a completed device. In such instances, the electronic device is often exposed to harsh conditions and corrosive materials. In known devices, a substrate is bonded to a substrate carrier by using an organic, often a polymeric based, adhesive or adherent. However, over time, due to environmental conditions such as the presence of solvents, to which the adhesive is exposed, the bond may be partially damaged or completely broken. In turn, this may result in the exposure of sensitive electronic components to the environment. These components would then be damaged and the device potentially rendered non-functional.

One application where a substrate is bonded to a carrier is a fluid ejection device, such as ink jet print head. In these devices a substrate containing multiple fluid ejection elements is often bonded to a substrate carrier.

DETAILED DESCRIPTION OF THE DRAWINGS

Examples of particular feature size, shape, and arrangement are depicted herein. However, any type of feature size and geometry may be fabricated using the inventive methods and apparatuses described herein.

Figure 1:
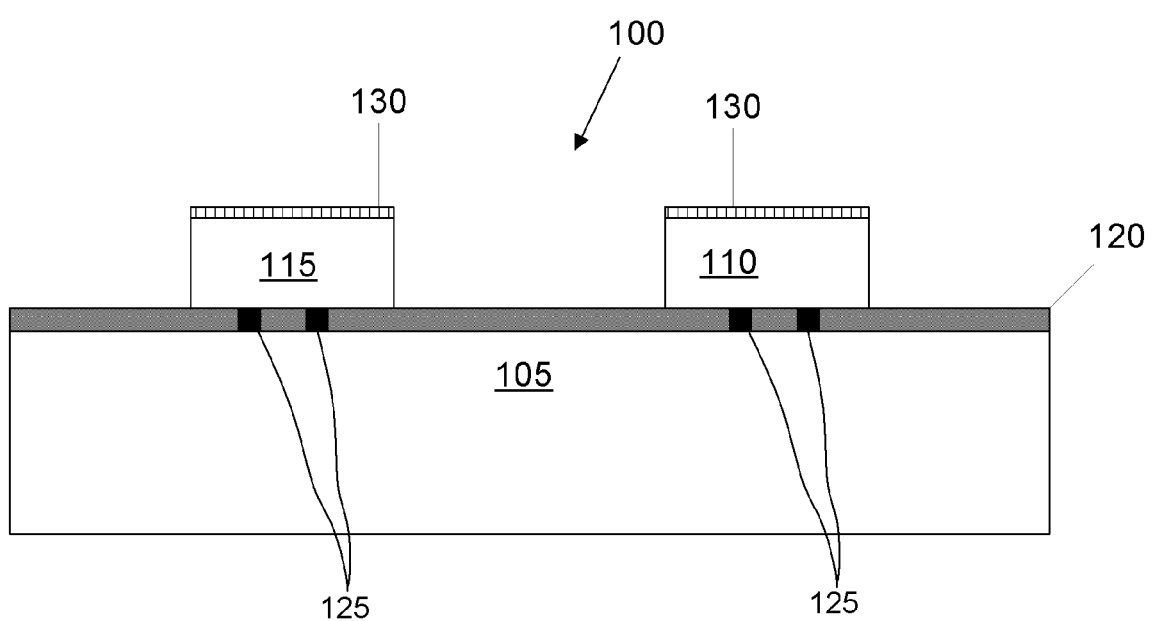
FIG. 1 illustrates a cross-sectional view of one embodiment of an electronic device.

Referring to FIG. 1, a cross-sectional view of one embodiment of an electronic device is illustrated. An electronic device 100 includes a substrate 105 and several other substrates 110 and 115 that are bonded to it. A layer of inorganic material 120 is formed on the surface of substrate 105 and then the combination of substrate 105 and inorganic material are subject to plasma treatment, as are substrates 110 and 115. After plasma treatment, substrates 110 and 115 are bonded to the inorganic layer 120, thereby forming a covalent bond between substrate 110 with inorganic material 120, and substrate 105, as well between each of substrate 115 with inorganic material 120, and substrate 105.

In one embodiment, a protective material 130 may be formed on one or more of the surface of substrates 110 and 115 that are bonded to substrate 105.

In certain embodiments, by utilizing plasma-enhanced bonding the substrates are joined directly at the atomic-level with robust covalent siloxane bonds. In such embodiments, the utilization of inorganic material 120 allows for the formation of such bonds, regardless of the material that is used for substrate 105. It should be noted that inorganic material need not be applied to the entirety of the surface of substrate 105. Inorganic material 120 may be formed in any geometric pattern, for example along a perimeter of substrate 105, so that sufficient bond strength is provided while areas to on which devices may be formed are free of inorganic material 120.

Contacts 125 are formed or otherwise provided in inorganic material 120 in order to provide conductive paths between contacts, not shown, of substrate 105 and substrates 110 and 115. Contacts 125 are generally formed prior to plasma treatment of substrate 105 and inorganic material 120. Alternatively, areas of the substrate 105 that are to be electrically coupled to areas of substrates 110 and 115 may be free of the electronic material.

Inorganic material 120 may be any inorganic material that after being plasma treated provides an increase in the density of chemical interface species to facilitate bonding between substrate 105 and substrates 110 and 115. In certain embodiments, inorganic material 120 may be Tetraethyl Orthosilicate (TEOS), aluminum oxide, amorphous silicon, silicon nitride, silicon carbide, oxynitride, sapphire, indium phosphide, or a glass frit material.

The material(s) for forming substrate 105 may be dependent on various factors including, for example, the type of electronic device being fabricated and the environment in which the electronic device is to be operated. Substrate 105 may be a ceramic, a glass, a semiconductor, a metal, a metal-coated structure, a polymer, combinations thereof, and others. Metals and metal coatings may include, for example, aluminum, chromium, copper, gold, lead, nickel, platinum, solder, stainless steel, tin, titanium, alloys thereof, combinations thereof, and others. Ceramics may include, for example, aluminum nitride, aluminum oxide, silicon carbide, silicon oxide, silicon oxynitride, combinations thereof, and others; alternatively aluminum nitride, aluminum oxide, silicon carbide, silicon oxynitride, and combinations thereof.

Electronic device 100 may be any electronic device package in which a semiconductor device or similar device such as an integrated circuit is attached to a substrate, such as a chip carrier. Electronic device 100 may be part of a single chip module, a multichip module, a stacked chip module, or another device. The electronic device may be used in optoelectronic, photonic, fluid ejection, microelectromechanical, or standard integrated circuit applications.

Figure 2:
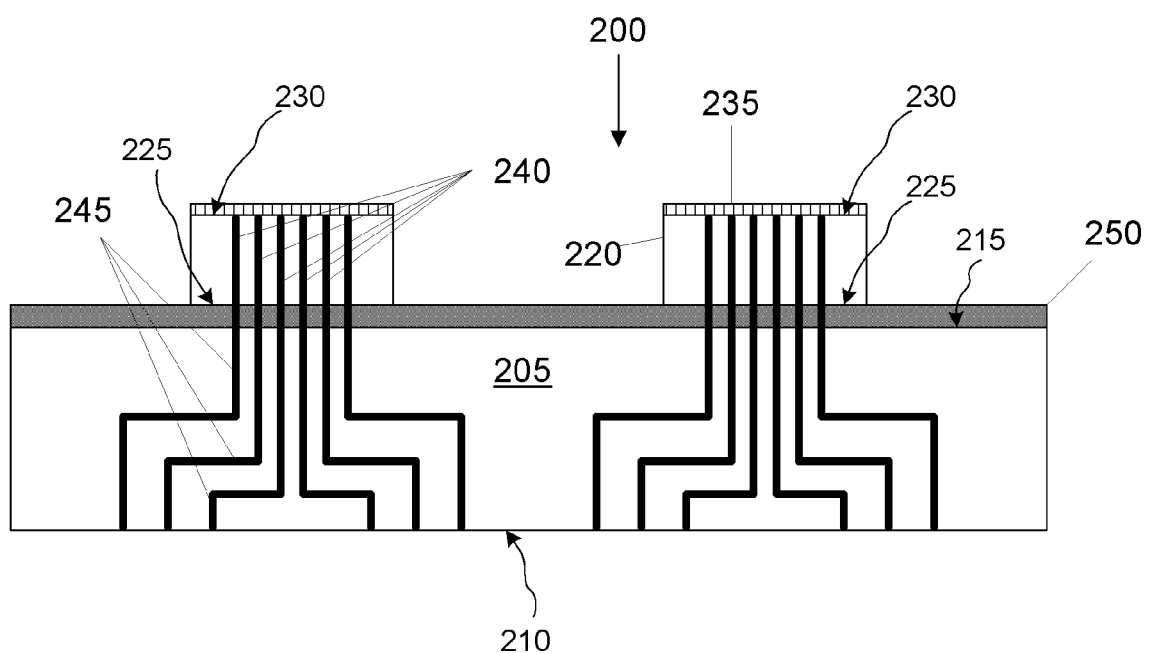
FIG. 2 illustrates a cross-sectional view of an embodiment of print heads bonded with a substrate carrier.

Referring to FIG. 2, a cross-sectional view of an embodiment of print heads bonded with a substrate carrier is illustrated. Fluid ejection device 200 includes a substrate carrier 205 and print heads 220. Substrate carrier 205 includes a first surface 210 and a second surface 215. A plurality of ink feed paths 245, formed in substrate carrier 205, are fluidically coupled to ink feed slots 240 formed within and/or on print heads 220.

A second surface 215 of substrate carrier 205 includes an inorganic material 250 disposed thereon. Inorganic material 250, after plasma treatment, is mated to a second surface 225 of print heads 220 which opposes first surface 230.

In FIG. 2, thin film layers (or active layers, a thin film stack, electrically conductive layers, or layers with micro-electronics) 235 are formed, e.g. deposited or grown, on a front or first side (or surface) 230 of the print heads 220. The first side 230 of the print heads 220 is opposite a second side (or surface) 225 of the print heads 220. The thin film layers 235 includes at least one layer formed on the print heads 220, and, in a particular embodiment, masks at least a portion of the first side 230 of the print heads 220. Alternatively or additionally, the one or more of the thin film layers 235 electrically insulate at least a portion of the first surface 230 of the print heads 220.

Substrate carrier 205 may be a ceramic, a metal, a metal-coated structure, a polymer, combinations thereof, or others. Metals and metal coatings may include, for example, aluminum, chromium, copper, gold, lead, nickel, platinum, solder, stainless steel, tin, titanium, alloys thereof, combinations thereof, and others. Ceramics may include, for example, aluminum nitride, aluminum oxide, silicon carbide, silicon oxide, silicon oxynitride, combinations thereof, and others; alternatively aluminum nitride, aluminum oxide, silicon carbide, silicon oxynitride, and combinations thereof.

In one embodiment, the print heads 220 are silicon. In various embodiments, the print heads may be one of the following: single crystalline silicon, polycrystalline silicon, gallium arsenide, glass, silica, ceramics, or a semiconductor material. The various materials listed as possible substrate materials are not necessarily interchangeable and are selected depending upon the application for which they are to be used.

In certain embodiments, inorganic material 250 need not be present and second surface 215 of substrate carrier 205 may be directly mated with second surface 225 of print heads 220. In such embodiments, both substrate carrier 205 and print heads 220 may comprise a semiconductor material.

Figure 3A:
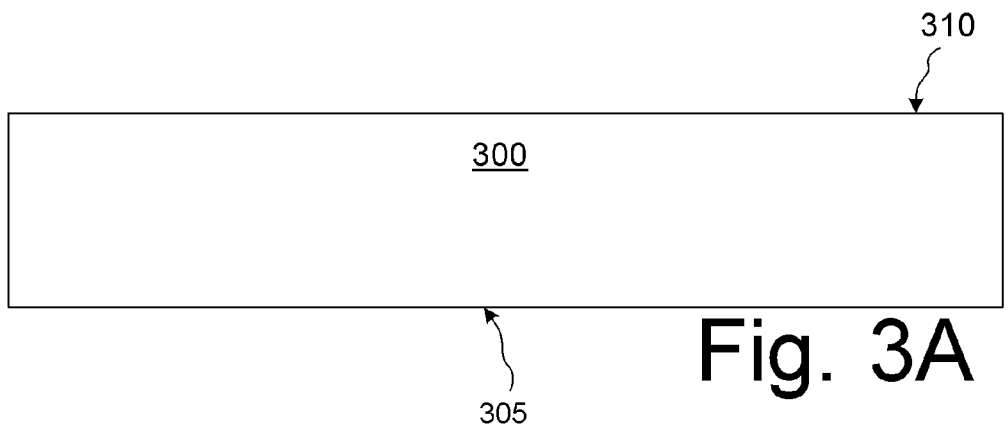
FIGS. 3A-E illustrate cross-sectional representations of process steps showing bonding of an exemplary substrate and substrate carrier in accordance with one embodiment.

Referring to FIGS. 3A-3E, cross-sectional representations of process steps for forming a fluid ejection device in accordance with one embodiment are illustrated. A substrate carrier or other substrate structure 300 includes a first surface 305 and a second surface 310 substantially opposing first surface 305 (FIG. 3A).

Figure 3B:
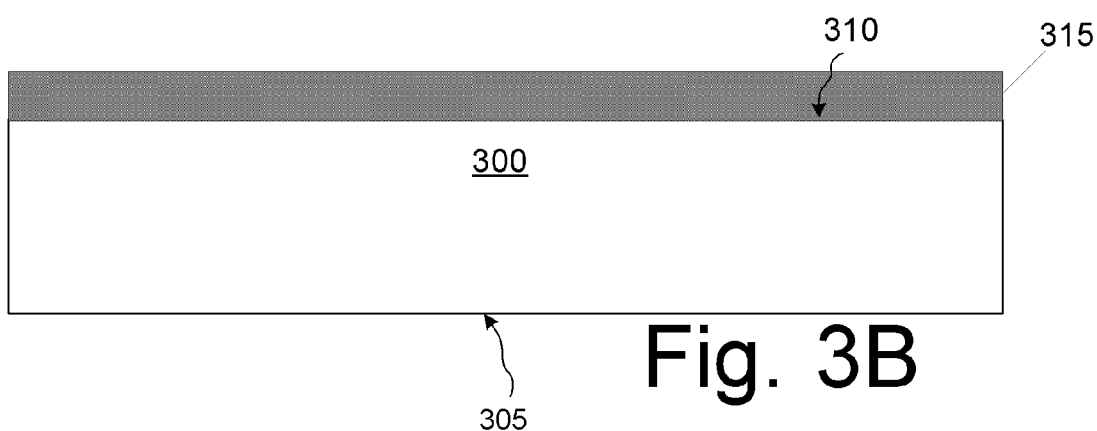

An inorganic material 315 is applied to second surface 310 (FIG. 3B). The inorganic material 315 may be applied, in certain embodiments, by physical vapor deposition (PVD), chemical vapor deposition (CVD), e.g. plasma-enhanced CVD, low temperature CVD, low-pressure CVD, or electron beam deposition.

Figure 3C:
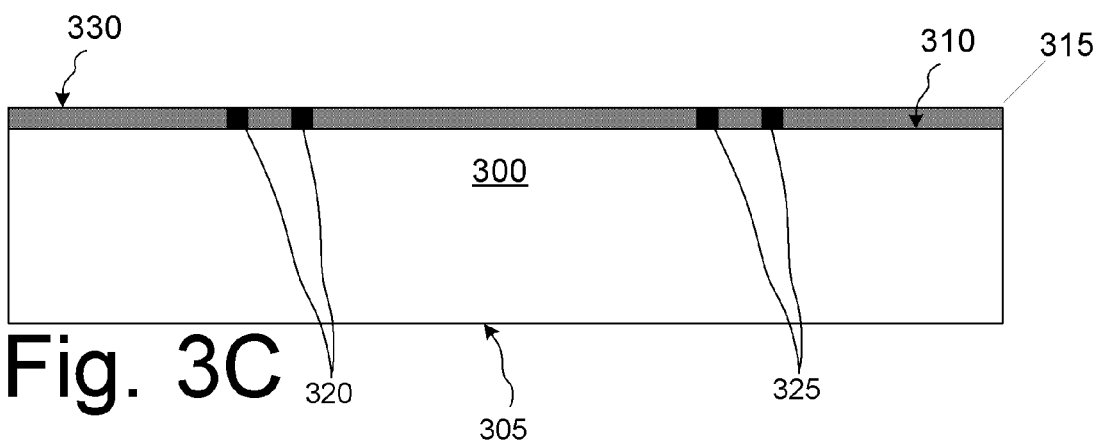

After deposition, the inorganic material 315 is planarized and one or more contacts 320 and 325 are formed therein to allow contact with electrical contacts formed on or in first surface 305 of substrate structure 300 (FIG. 3C). Planarization can be performed by, for example, chemical mechanical polishing, as is known. In certain embodiments, chemical mechanical polishing may result in a surface 330 of inorganic material 315 that has a roughness of no greater than a two-nanometer variation root mean squared over a four micron square area of surface 330.

After planarization, inorganic material 315 on substrate 300 is treated by utilizing a plasma treatment process. In one embodiment the plasma treatment process comprises utilizing an inductively plasma chamber where the substrate structure is biased at approximately 120 watts, while high density plasma is generated by an inductive coil upstream with approximately 500 watts power. In other embodiments, various types of plasma treatment processes may be used, including, but not limited to, corona discharge treatment, dielectric barrier discharge treatment, and glow discharge treatment. Glow discharge treatment can be carried out using plasma selected from low pressure glow discharge or atmospheric pressure glow discharge. In certain embodiments, plasma treatment may be performed at atmospheric pressure in a continuous process using appropriate atmospheric plasma apparatuses. Other plasma treatment processes may also be used.

The exact conditions for plasma treatment will vary depending on various factors including the choice of material, the storage time between plasma treatment and bonding, the type and method of plasma treatment used, the design of the plasma chamber used, and others. However, in certain embodiments plasma treatment may be carried out at a pressure of up to about atmospheric pressure.

In one embodiment plasma treatment lasts about one hundred seconds. In other embodiments, the length of plasma treatment depends on various factors including the material to be treated, the contact conditions selected, the mode of plasma treatment (e.g., batch vs. continuous), and the design of the plasma apparatus. Plasma treatment is carried out for a time sufficient to render the surface of the material to be treated sufficiently reactive to form a high density covalent bond.

In one embodiment, the gas utilized during plasma treatment may be nitrogen, oxygen, argon, or combinations thereof. In other embodiments, the gas used in plasma treatment may be air, ammonia, carbon dioxide, carbon monoxide, helium, hydrogen, nitrous oxide, ozone, water vapor, combinations thereof, and others. Additionally, the gas utilized may be selected from air, carbon dioxide, carbon monoxide, helium, nitrogen, nitrous oxide, ozone, water vapor, and combinations thereof. Alternatively, the gas may be selected from air, argon, carbon dioxide, helium, nitrogen, ozone, and combinations thereof. Alternatively, other more reactive organic gases or vapors can be used, either in their normal state of gases at the process application pressure or vaporized with a suitable device from otherwise liquid states, such as hexamethyldisiloxane, cyclopolydimethylsiloxane, cyclopolyhydrogenmethylsiloxanes, cyclopolyhydrogenmethyl-co-dimethylsilo-xanes, reactive silanes, combinations thereof, and others.

After plasma treatment, a wet treatment is applied to the surface or surfaces which have been subject to plasma treatment for substrate cleaning and hydrophilization treatment for bonding. In certain embodiments, the wet treatment may utilize a liquid that comprises deionized water. In other embodiments, the liquid utilized may comprise SC1, which may have a structure (25 $H_2O$: 2 $H_2O_2$: 1 $NH_4OH$). The surface will be exposed to SC1 fluid for 40 seconds, rinsed with deionized water, and then dried in air or nitrogen. When SC1 is utilized, the SC1 renders the surface hydrophilic and creates a terminated —OH group. The utilization of a wet treatment may provide benefits such that when two hydrophilic surfaces are brought into contact at room temperature, substrates form a hydrogen bond spontaneously.

Figure 3D:
Figure 3E:
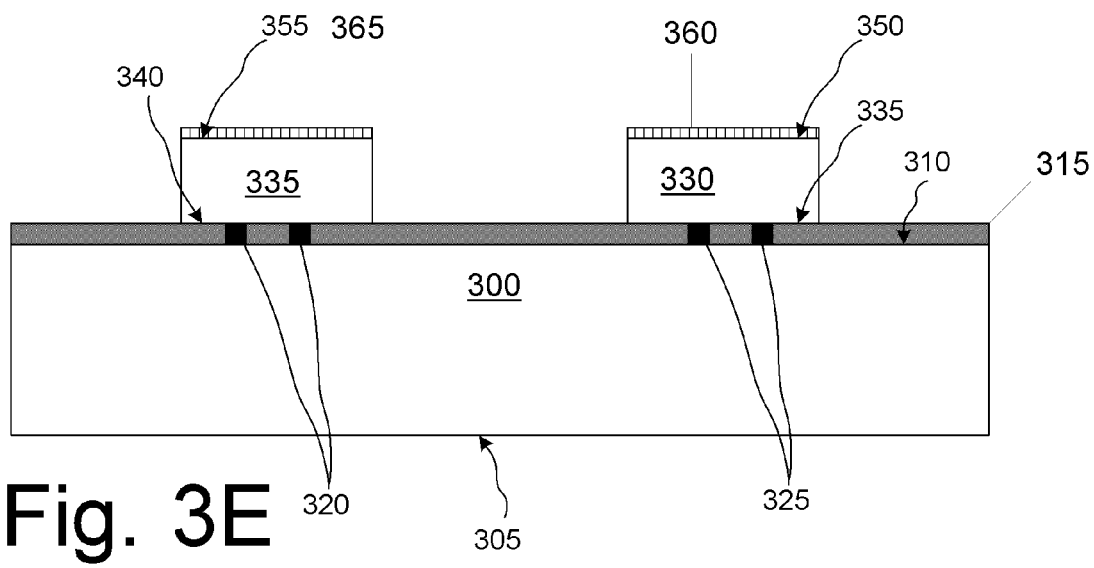

One or more substrates 335 and 340 are provided. (FIG. 3D). The substrates 335 and 340 may include one or more structures 355 and 370 formed on respective first surfaces 350 and 365. These structures 355 and 370 may comprise sensors, optical, electrical, or electromechanical structures or circuits that perform different functions as desired. The second surfaces 345 and 360, respectively, of substrates 335 and 340 are then subject to a plasma treatment process, similar to those that is utilized for inorganic material 315 and substrate structure 300.

Substrates 335 and 340 are then mated with inorganic material 315 on substrate 300. Mating may utilize a pick and place tool, as is known, to position substrates 335 and 340 and substrate structure 300 so that proper alignment is achieved. For instance, the contacts or fluid paths in substrates 335 and 340 are properly aligned with corresponding structures in inorganic material 315 and substrate structure 300.

In certain embodiments, mating of substrates 335 and 340 and inorganic material 315 and substrate structure 300 may occur immediately after wet treatment on inorganic material 315 and substrate structure 300. In other embodiments, mating may occur within approximately twenty-four hours of the application of fluid.

After mating, the mated structure is annealed. Annealing may take place at temperatures greater than approximately one hundred ten degrees Celsius. In other embodiments, the annealing temperature may be approximately two hundred degrees Celsius. It is believed that, in certain embodiments, annealing may cause water molecules to start leaving the interface between inorganic material 315 and the second surfaces 345 and 360 of substrates 335 and 340 by diffusing out of wafer through bond interface or by diffusing through the native oxide to react with silicon substrate. In such embodiments, as water molecules are removed stronger siloxane bonds start to form, e.g. Si—OH HO—Si====>Si—O—Si+$(H2O)_n$.

In certain embodiments, e.g. in MEMS applications, it may be desirable to keep annealing temperatures below approximately four hundred degrees Celsius to prevent the development of a built-in stress in the package or so that the degradation of CMOS devices can be avoided.

While the description with respect to FIGS. 3A-3E discusses wet-treatment after plasma treatments, such actions need not be utilized. In other embodiments, it is also possible to plasma treat and bond substrates 335 and 340 and substrate structure 300 without wet-treatment, and mating them immediately. In an alternative embodiment, the surface may also be hydrated by exposing the surface to a moisture source during or after plasma treatment. This approach may be beneficial for certain types of MEMS packaging since it does not introduce any moisture to the package.

It is believed that the approach described with respect to FIGS. 3A-E allows for a bond that joins two substrates directly at the atomic-level with a robust covalent siloxane bonds.

Referring to FIGS. 4A-4H, cross-sectional representations of process steps for forming portions of a fluid ejection device in accordance with one embodiment are illustrated. A substrate 400 includes thin film layers 415 formed on a first surface 410. A number of chambers 430 are formed in thin film layers 415. The chambers 430 include a volume of fluid that is to be ejected based upon signals provided to the thin film layers 415. A protective layer 420 is formed over thin film layers 415 in order to protect thin film layers 415 during processing of substrate 400.

A protective layer 435 is also provided on the second surface 425 of substrate 400 in order to protect portions of the backside surface 425 that are not subject to processing. In certain embodiments, second surface 425 is planarized, e.g. by a chemical mechanical polishing process, prior to application of protective layer 435. In other embodiments, substrate 400 comprises a double-sided polished wafer prior to processing. In some embodiments, protective layer 435 may comprise a nitride, carbide, or oxide layer as is known.

Figure 4A:
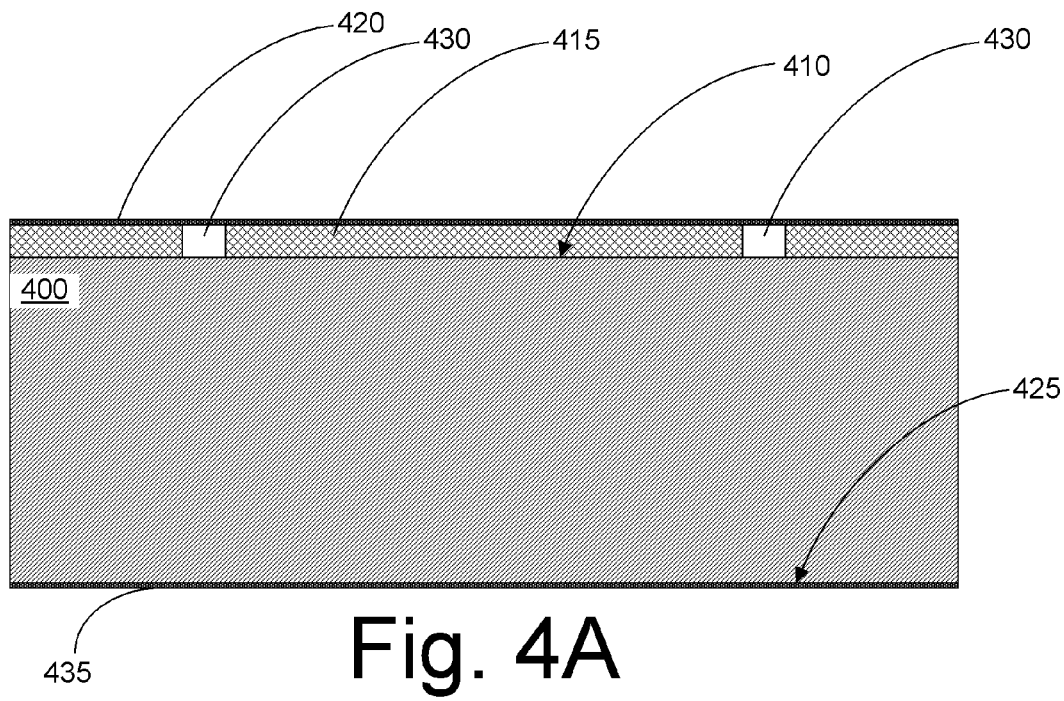
FIGS. 4A-H illustrate cross-sectional representations of process steps for forming portions of a fluid ejection device in accordance with one embodiment.
Figure 4B:
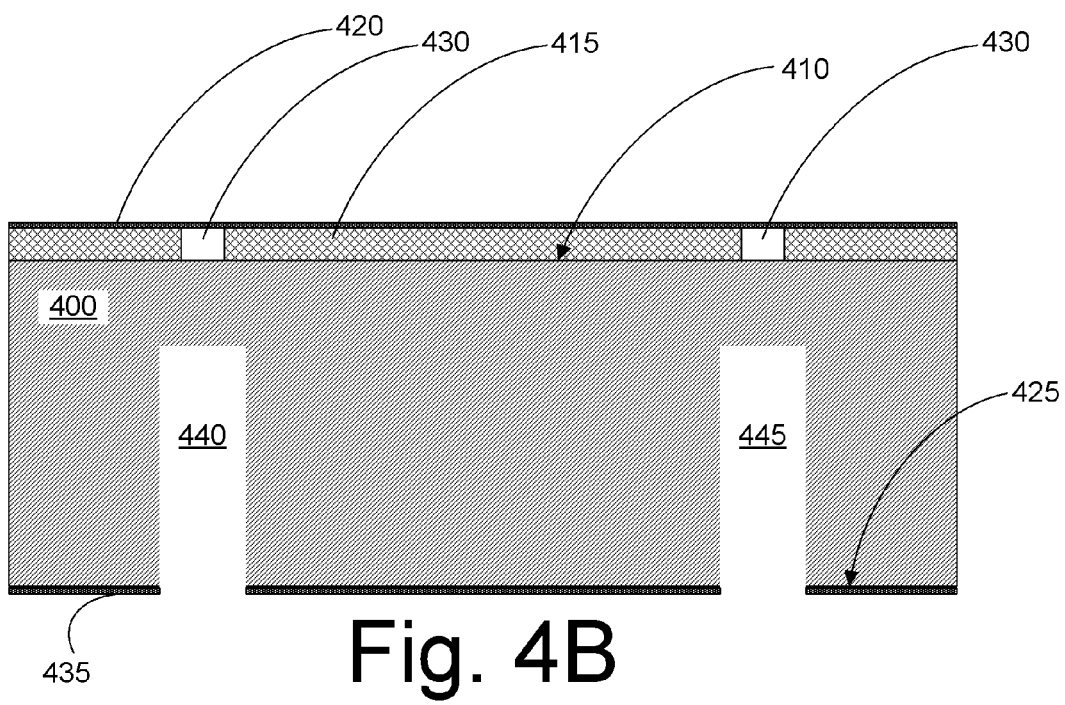

In FIG. 4B, fluid channels 440 and 445 are formed via a process method formed through second surface 425. In some embodiments, processes such as laser ablation, wet etching, dry etching, and mechanically removing such as abrasive jet machining and sawing, or combinations thereof.

Figure 4C:
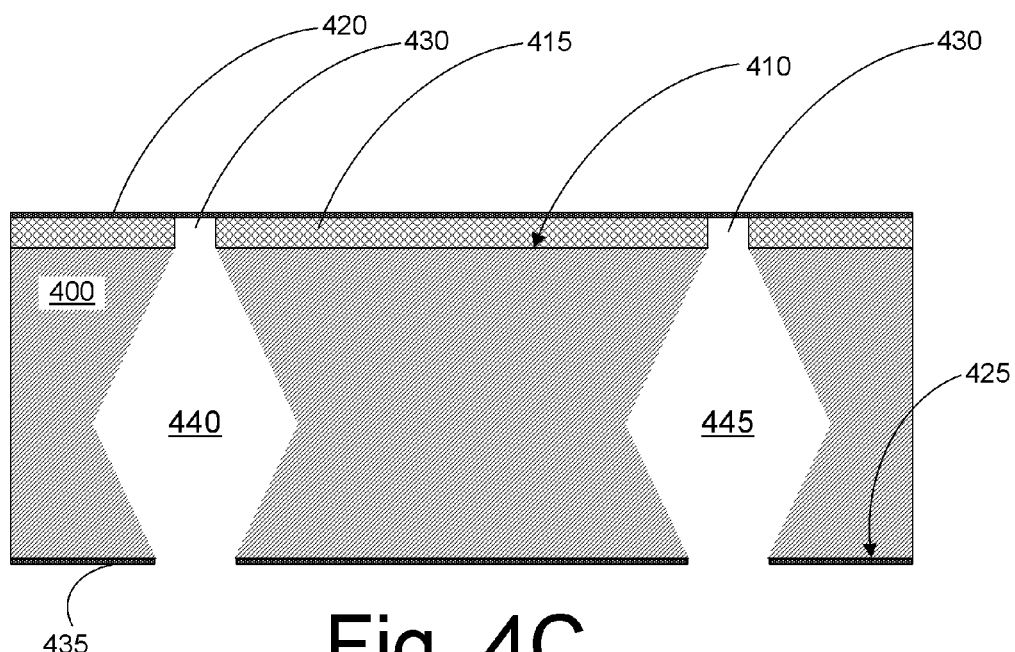

In FIG. 4C, fluid channels 440 and 445 are further formed to have a desired shape that is consistent with the desired fluid flow. The shaping of fluid channels 440 and 445 may be performed by, for example, a wet etch process. Further, fluid channels 440 and 445 may shaped after fluid channels 440 and 445 form through channels between first surface 410 and second surface 425. In addition, it is possible that a trench is formed in portions of first surface 410 through which fluid channels 440 and 445 are to be formed prior to formation of the fluid channels 440 and 445 through second surface 425. Further, the shape and geometry of fluid channels may be different than that which is depicted in FIGS. 4A-4H.

Figure 4D:
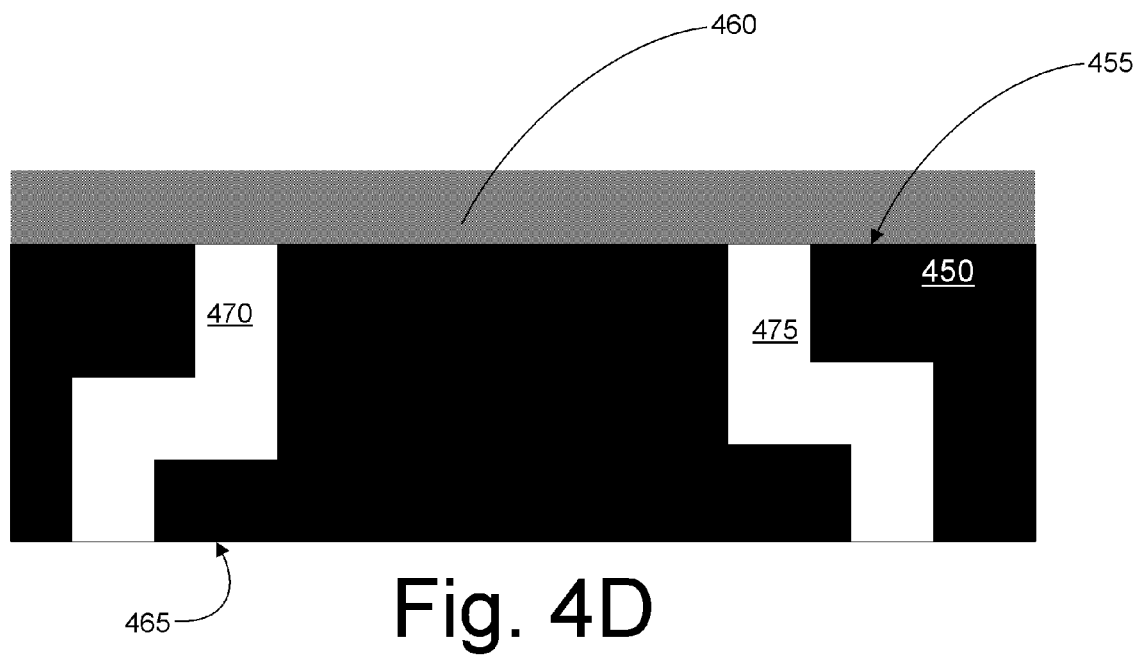

In FIG. 4D, a substrate carrier 450 includes fluid paths 470 and 475 therein that are to provide fluid to fluid channels 440 and 445 of substrate 400. Fluid paths 470 and 475 provide fluid flow paths between a first surface 455 and a second surface 465 of substrate carrier 450. At second surface 465, fluid paths 470 and 475 are fluidically coupled to a fluid supply that is to supply fluid for ejection from the chambers 430 formed on substrate 400.

Substrate carrier 450 may comprise, for example, ceramic, metal or other material. An inorganic material 460 is applied to a first surface 455 in order to facilitate bonding of the wafer 400 and the substrate carrier 450. In certain embodiments, inorganic material 460 may comprise TEOS, aluminum oxide, amorphous silicon, silicon nitride, silicon carbide, oxynitride, indium phosphide, sapphire, and a glass frit material amongst others.

Figure 4E:
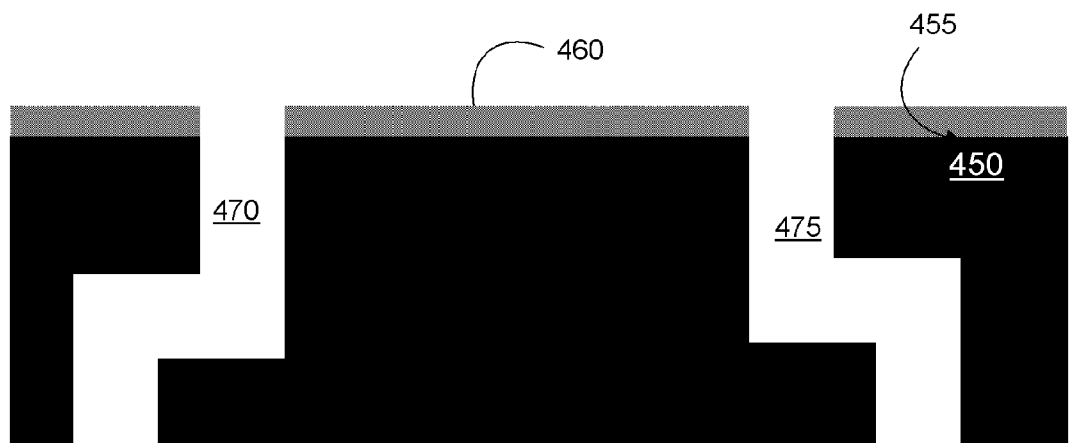

Inorganic material 460 is then planarized, FIG. 4E, and any material that may have been provided such that it blocks fluid paths 470 and 475 is removed. In certain embodiments, planarization is performed in order to strengthen the bond between substrate 400 and substrate carrier 450. In some embodiments, a roughness of inorganic material 460, after planarization, is no greater than a two-nanometer root mean squared variation over a four micron square area.

Figure 4F:
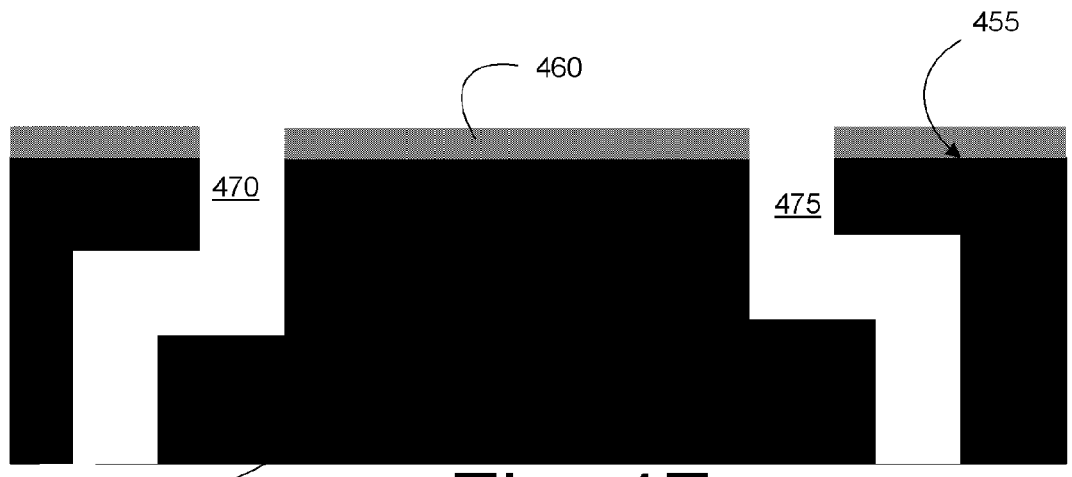
Figure 4G:
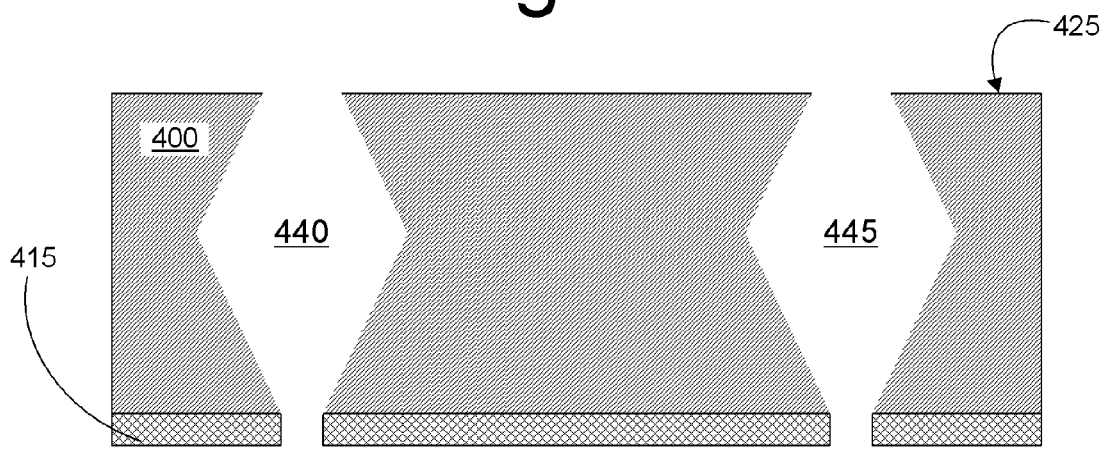

In FIGS. 4F and 4G, inorganic material 460 on first surface 455 of substrate carrier 450 and second surface 435 of substrate 400 are subject to a plasma treatment process. The plasma treatment processes may be similar to those described and discussed with respect to FIGS. 3A-3E. Further, plasma treatment of inorganic material 460 on first surface 455 of substrate carrier 450 and second surface 425 of substrate 400 may occur at the same or different times.

It should be noted that protective material 435 is removed prior to plasma treatment of second surface 425.

After, plasma treatment, wet treatment is done to the inorganic material 460 for cleaning and hydrophilization treatment for bonding. In certain embodiments, the wet treatment may utilize a liquid that may comprise deionized water. In other embodiments, the liquid may comprise SC1, which may have a structure (25 $H_2O$: 2 $H_2O_2$: 1 $NH_4OH$).

Figure 4H:
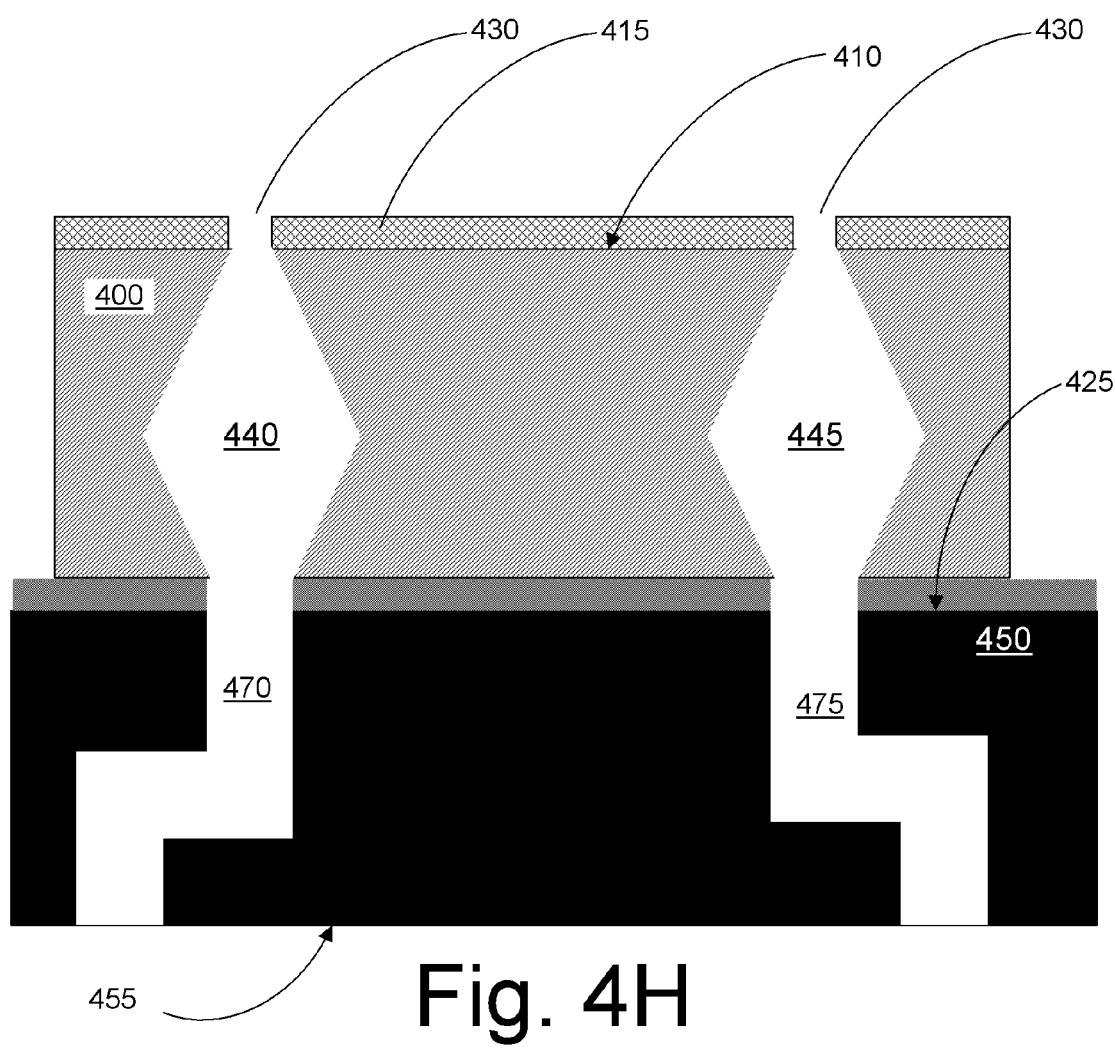

After the wet treatment is done to inorganic material, the second surface 425 is mated to the inorganic material 460 on first surface 455, FIG. 4H. Mating may be performed by, for example, a pick and place tool. The mated structure is then annealed. Annealing may take place at temperatures greater than approximately one hundred ten degrees Celsius. In other embodiments, the annealing temperature may be approximately two hundred degrees Celsius.

Figure 5A:
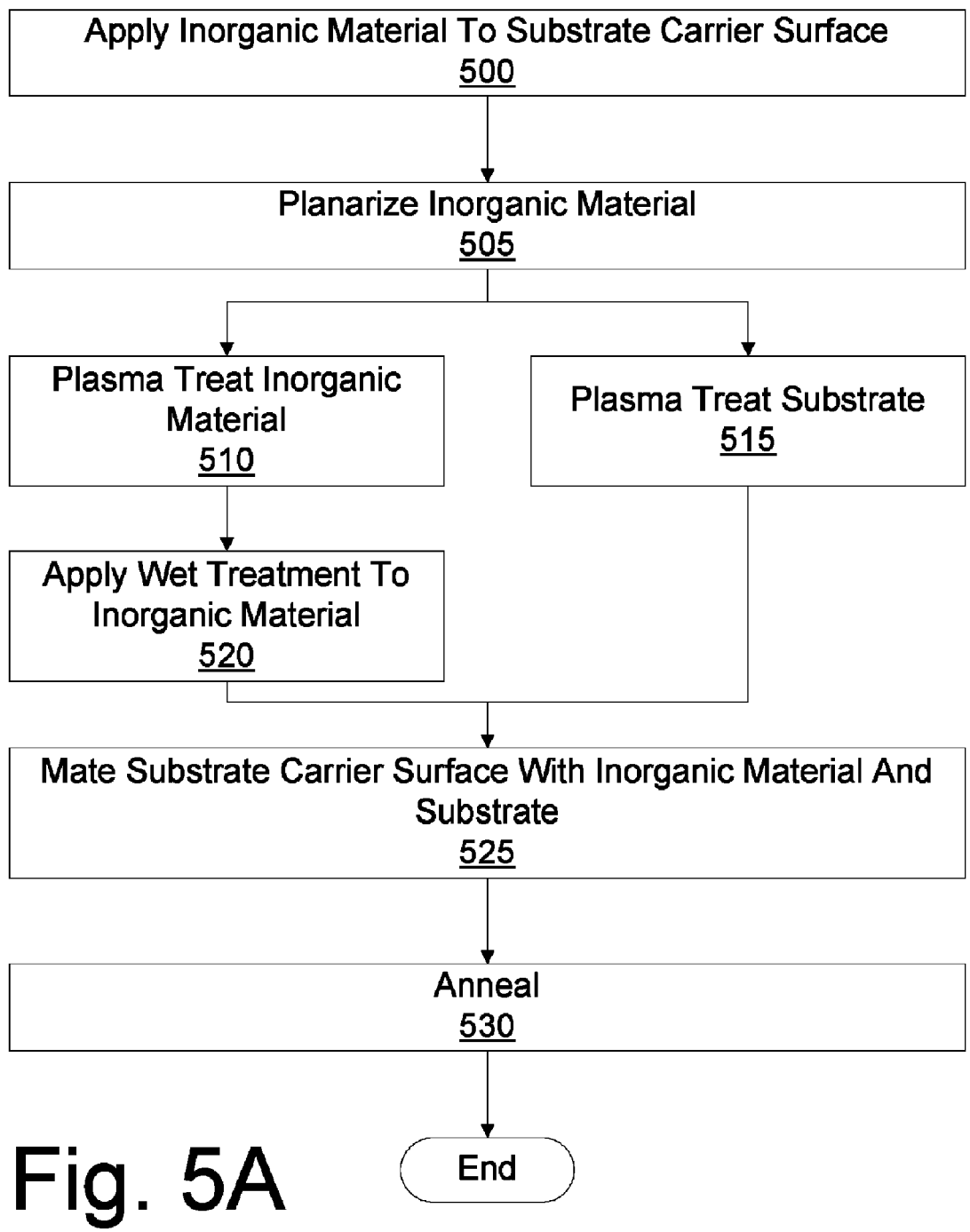
FIG. 5A illustrates a process for forming electronic devices according to one embodiment.

Referring to FIG. 5A, a process for forming electronic devices according to one embodiment is illustrated. An inorganic material is applied to a surface, to which a substrate is to be bonded, of a substrate carrier or fixture, block 500. The inorganic material is then planarized, block 505. In one embodiment, planarization is performed so that the inorganic material has a height variation of no greater than a two-nanometers root-mean-squared over a four micron square area. In other embodiments, other height variations, using the same or different measures, may be utilized.

The planarized inorganic material is subject to plasma treatment, block 510. The substrates, or substrates, that are to be bonded to the substrate carrier or fixture, are also plasma treated, block 515. The plasma treatment of both the substrate and substrate carrier may use the same or different processes and may occur at the same or different times. After plasma treatment, wet treatment is applied to the inorganic material for substrate cleaning and hydrophilization treatment, block 520. Such wet treatment may also be applied to the substrate, in certain embodiments.

The substrate carrier surface with the inorganic material thereon and the substrate are mated together, after plasma treatment, block 525. The mated substrate carrier and substrate are then annealed in order to promote covalent bonding between the inorganic material and the substrate, block 530.

Figure 5B:
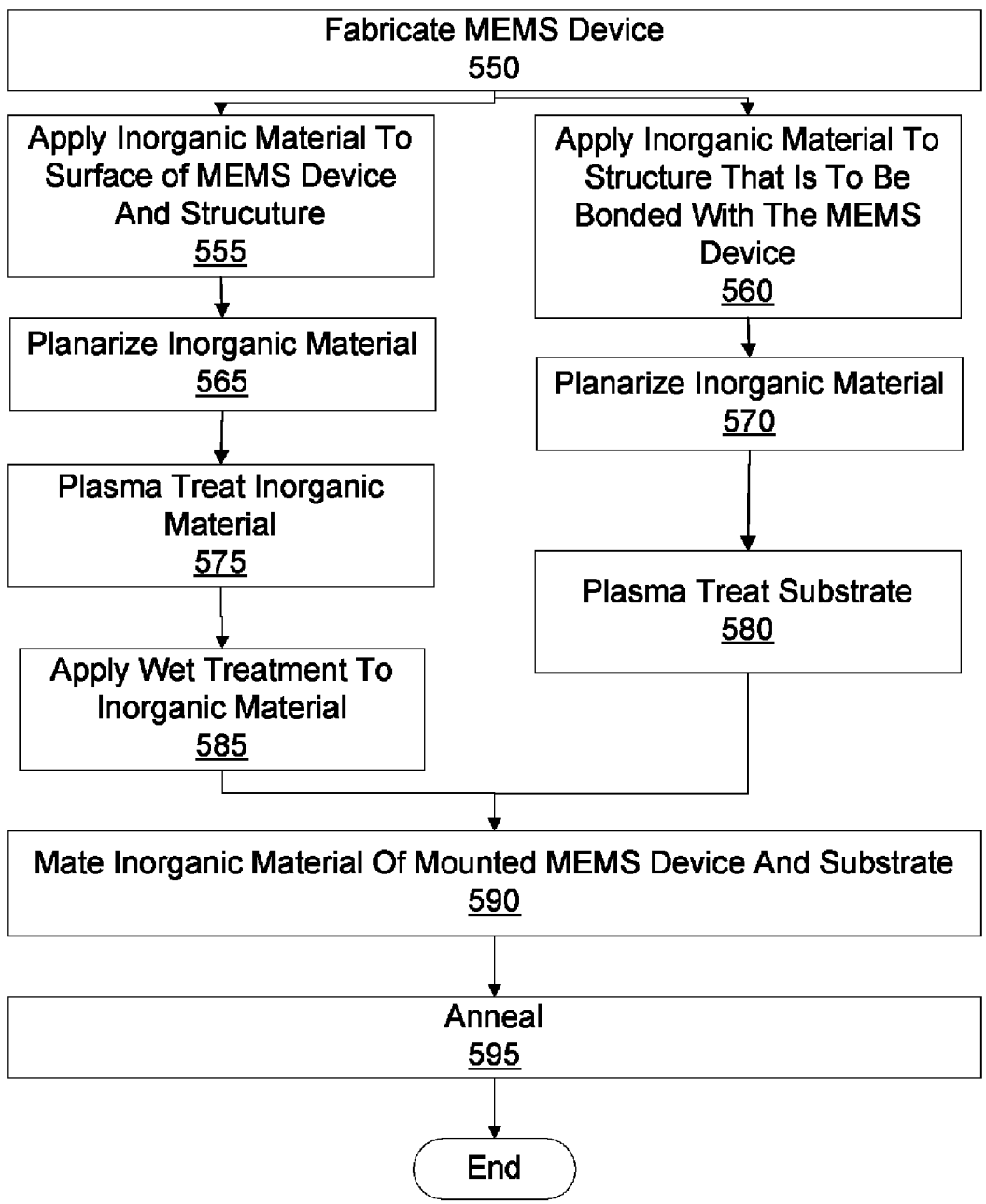
FIG. 5B illustrates a process for forming micro-electromechanical devices according to one embodiment.

Referring to FIG. 5B, a process for forming micro-electromechanical devices is illustrated. A MEMS device is fabricated, block 550. MEMS device may be fabricated utilizing any know process or any combination of known processes. An inorganic material is then applied to one or more surfaces of the MEMS device that are to be bonded to a carrier or support structure, block 555. The same or different inorganic material is also applied to a surface or surfaces of a structure that is to be bonded with the MEMS device, block 560. Planarization, blocks 565 and 575 respectively, may be performed so that the inorganic material has a height variation of approximately no greater than a two-nanometers root-mean-squared over a four micron square area is provided. In other embodiments, an atomic layer or other deposition may be utilized that provides the desired height variations over small areas, e.g. four micron areas, of the structures that facilitate bonding of the MEMS device and carrier or support structure.

The inorganic material of the MEMS device, having the desired height variation, is subject to plasma treatment, block 585. The inorganic material of the carrier or support structure, having the desired height variation over small areas, is also plasma treated, block 580. The plasma treatment of both the support structure and MEMS device may use the same or different processes and may occur at the same or different times. A wet treatment is applied to the plasma treated inorganic material block 585. Such wet treatment may also be applied to the substrate, in certain embodiments.

The MEMS device with the inorganic material thereon and the support structure are mated together, block 590. The mated structure is then annealed in order to promote covalent bonding, block 595.

Figure 5C:
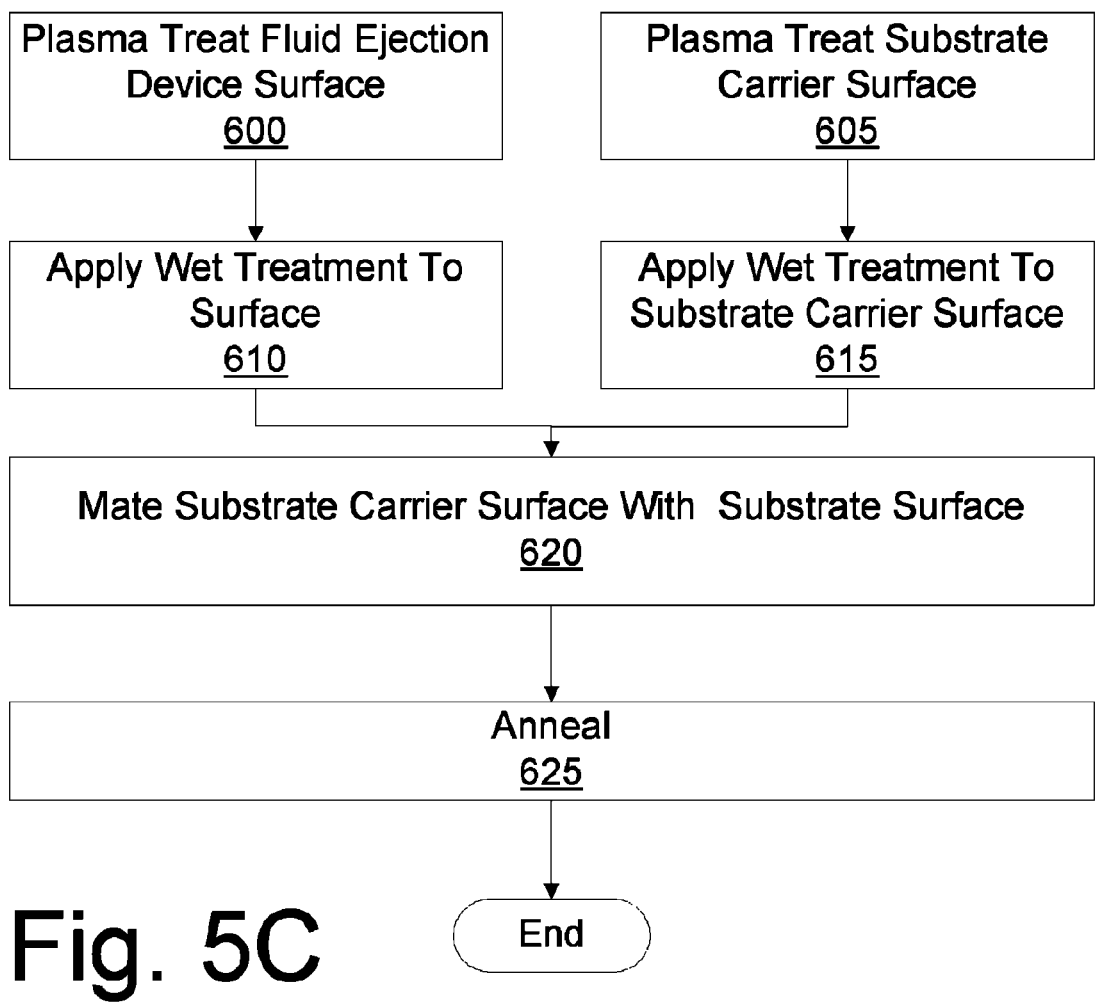
FIG. 5C illustrates a process for forming fluid ejection devices according to one embodiment.

Referring to FIG. 5C, a process for forming fluid ejection devices according to one embodiment is illustrated. A fluid ejection device, such as a print head, includes a number of fluid ejection elements formed on a surface of a substrate. The surface of the substrate opposing the surface on which the fluid ejection elements are formed is plasma treated, block 600. Also, a substrate carrier that is to provide fluid paths to the fluid ejection elements and electrical connection to a control device is plasma treated, block 605. The treatment may be of a surface that is to be bonded to the surface of the substrate.

In certain embodiments, an inorganic material need not be applied to either the surfaces of the substrate or substrate carrier that are to be bonded together. In such embodiments, the substrate carrier and substrate may comprise a semiconductor material such as silicon.

The surface of the substrate that has been plasma treated is then subject to a wet treatment, block 610. Also, the surface of the substrate carrier that has been plasma treated is subject to a wet treatment, block 615. The timing of the wet treatment may be simultaneous or occur at different times. The wet treated surface of the substrate and the wet treated surface of the substrate carrier are mated together, block 620. The mated structure is then annealed, block 625.

It should be noted, that in certain embodiments that one or both of the surface of the substrate and surface of the substrate carrier that are to be subject to plasma treatment may be planarized prior to plasma treatment.

Figure 6:
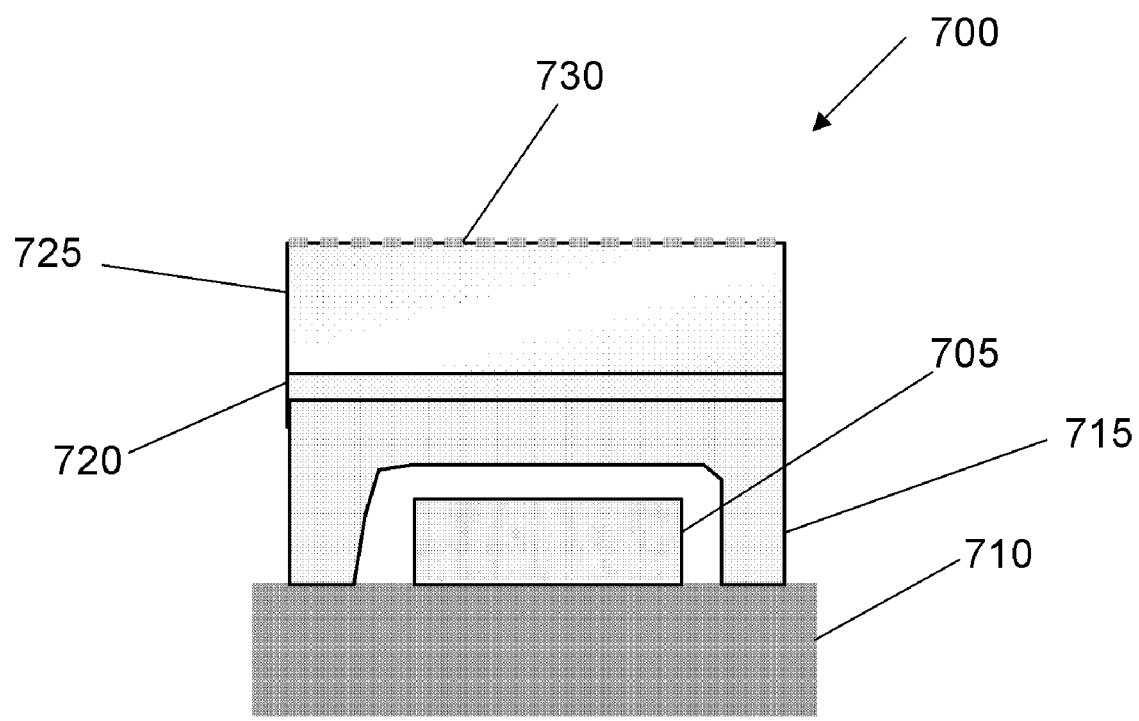
FIG. 6 illustrates a cross-sectional view of one embodiment of a MEMS device.

Referring to FIG. 6, a cross-sectional view of one embodiment of a MEMS device is illustrated. In the embodiment of FIG. 6, micro-electromechanical device 600 may be an optoelectrical device. In other embodiments, micro-electromechanical device 700 may be pressure sensor, photonic, fluid ejection, or other micro-electromechanical that comprises multiple substrates bonded to each other or a substrate bonded to a carrier structure.

In FIG. 6, an optical device 705 is formed on a substrate 710 that includes electrical components for receiving signals from or transmitting signals to electrical components, as well as other processing functions. A membrane of optical energy transmissive inorganic material 715 may surround optical device 705 for protection of optical device 705. A transmissive material 725, with an inorganic material 720 formed thereon is bonded to inorganic material 715.

In one embodiment, transmissive material 725 may be provided to attenuate optical energy and/or to protect optical device 705 from the external environment. In certain embodiments, transmissive material 725 may be glass or a mixture of glass and one or more other materials. An anti-reflective coating 730 may be applied to a surface or surfaces of transmissive material 725 that interact with an external environment.

Micro-electromechanical device 700 may be utilized as an optical switch, as a mirror element for a light projector, or other optical device. In addition, micro-electromechanical device 700 may comprise a photonic, a device including mechanically deformable elements, signal transmission elements or combinations therefore.

Figure 7:
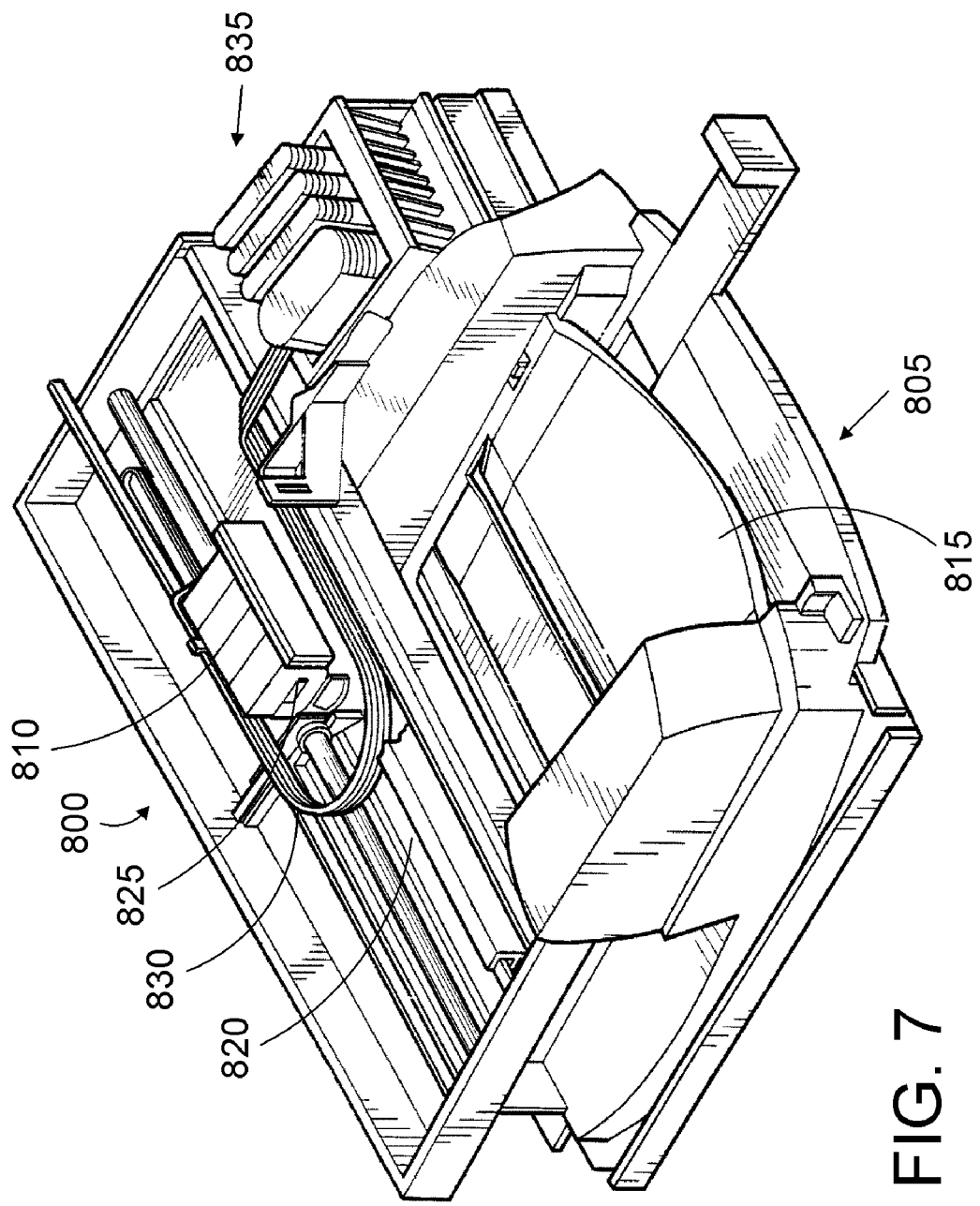
FIG. 7 illustrates a perspective view of an embodiment of a printer.

Referring to FIG. 7, a perspective view of an embodiment of a printer is illustrated. In this embodiment the printing device comprises a printer 800. The printer shown here is embodied in the form of an inkjet printer. The printer 800 can be capable of printing in black-and-white and/or in color. The term "printing device" refers to any type of printing device and/or image forming device that employs slotted substrate (s) to achieve at least a portion of its functionality. Examples of such printing devices can include, but are not limited to, printers, facsimile machines, and photocopiers. In this exemplary printing device the slotted substrates comprise a portion of a print head which is incorporated into a print cartridge, an example of which is described below.

FIG. 7 illustrates a printer with a print cartridge according to one embodiment. Generally, printer 800 can incorporate one or more print cartridges 810, which is a type of fluid ejection device. Printer 800 can also include a tray 805 for holding print media. When a printing operation is initiated, print media, such as paper, is fed into printer 800 from tray 805 preferably using a sheet feeder (not shown). The sheet then brought around in a U direction and travels in an opposite direction toward output tray 815. Other paper paths, such as a straight paper path, can also be used. The sheet is stopped in a print zone 820, and a scanning carriage 825, supporting one or more print cartridges 810, is then scanned across the sheet for printing a swath of ink thereon. After a single scan or multiple scans, the sheet is then incrementally shifted using, for example, a stepper motor and feed rollers to a next position within the print zone 820. Carriage 825 again scans across the sheet for printing a next swath of ink. The process repeats until the entire sheet has been printed, at which point it is ejected into output tray 815.

The print cartridges 810 can be removeably mounted or permanently mounted to the scanning carriage 825. Also, the print cartridges 810 can have self-contained ink reservoirs (for example, the reservoir can be located within print head assembly body, e.g. the embodiment of fluid ejection device 5 in FIG. 1.) The self-contained ink reservoirs can be refilled with ink for reusing the print cartridges 810. Alternatively, each print cartridge 810 can be fluidly coupled, via a flexible conduit 830, to one of a plurality of fixed or removable ink supplies 835 acting as the ink supply. As a further alternative, the ink supplies 835 can be one or more ink containers separate or separable from print head assemblies.

Although the inventive concepts have been described in language specific to structural features and methodological steps, it is to be understood that the appended claims are not limited to the specific features or steps described. Rather, the specific features and steps are disclosed as preferred forms of implementing the inventive concepts.

What is claimed is:

1. An electronic device comprising:
    a substrate comprising a first surface and a second surface;
    a substrate carrier comprising a first surface and a second surface; and
    an inorganic material, other and different than and separate from the substrate and the substrate carrier, bonding the second surface of the substrate and the second surface of the substrate carrier,
    wherein the substrate and the substrate carrier each have a plurality of fluidic channels, the fluidic channels of the substrate being fluidically connected to the fluidic channels of the substrate carrier through the inorganic material.

2. The electronic device of claim 1 wherein the inorganic material is selected from a group consisting of TEOS, aluminum oxide, amorphous silicon, silicon nitride, silicon carbide, oxynitride, indium phosphide, sapphire, and a glass frit material.

3. The electronic device of claim 1 wherein the substrate comprises silicon and the substrate carrier comprises a ceramic.

4. The electronic device of claim 1 wherein a surface of the inorganic material being bonded to the second surface of the substrate comprises a variation of height of no more than approximately two nanometers root-mean-squared over any four micron squared area of the surface.

5. The electronic device of claim 1 further comprising another substrate comprising a first surface and a second surface, wherein the inorganic material bonds a first portion of the second surface of the first substrate to the second surface of the substrate carrier and a second portion of the second surface of the substrate carrier to the second surface of the another substrate.

6. The electronic device of claim 1 wherein the substrate comprises fluid ejection elements formed thereon.

7. The electronic device of claim 1 wherein the electronic device is one an optoelectronic, photonic, fluid ejection, and microelectromechanical device.

8. The electronic device of claim 1 wherein the substrate carrier comprises a ceramic, a metal, a metal-coated structure, a polymer, and combinations thereof.

9. The electronic device of claim 1, wherein the electronic device is an inkjet-printing device.

10. The electronic device of claim 1, wherein the electronic device is a fluid-ejection device.

\* \* \* \* \*

UNITED STATES PATENT AND TRADEMARK OFFICE
CERTIFICATE OF CORRECTION

PATENT NO.       : 8,174,094 B2                          Page 1 of 1
APPLICATION NO.  : 12/488571
DATED            : May 8, 2012
INVENTOR(S)      : Chien-Hua Chen et al.

It is certified that error appears in the above-identified patent and that said Letters Patent is hereby corrected as shown below:

In column 10, line 28, in Claim 7, delete "one an" and insert -- one of an --, therefor.

Signed and Sealed this
Eighth Day of January, 2013

David J. Kappos
*Director of the United States Patent and Trademark Office*